US011948940B2

(12) United States Patent
Liaw

(10) Patent No.: US 11,948,940 B2
(45) Date of Patent: Apr. 2, 2024

(54) MULTI-GATE DEVICE STRUCTURE

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/869,069

(22) Filed: Jul. 20, 2022

(65) Prior Publication Data

US 2022/0359504 A1 Nov. 10, 2022

Related U.S. Application Data

(63) Continuation of application No. 16/952,684, filed on Nov. 19, 2020, now Pat. No. 11,437,373.

(60) Provisional application No. 63/065,142, filed on Aug. 13, 2020.

(51) Int. Cl.
*H01L 27/088* (2006.01)
*H01L 29/423* (2006.01)
*H01L 29/786* (2006.01)

(52) U.S. Cl.
CPC .... *H01L 27/0886* (2013.01); *H01L 29/42392* (2013.01); *H01L 29/78696* (2013.01)

(58) Field of Classification Search
CPC ........... H01L 27/0886; H01L 29/42392; H01L 29/78696; H01L 27/088; H01L 29/1033; H01L 29/41725; H01L 29/42356; H01L 29/7831; H01L 29/785; H01L 21/823864; H01L 21/823807; H01L 21/823814;
(Continued)

(56) References Cited

U.S. PATENT DOCUMENTS 9,818,872 B2 11/2017 Ching
9,887,269 B2 2/2018 Ching
9,899,398 B1 2/2018 Colinge
(Continued)

FOREIGN PATENT DOCUMENTS

KR 20190122114 A 10/2019
KR 20200035335 A 4/2020
KR 20200037106 A 4/2020

*Primary Examiner* — Tong-Ho Kim
(74) *Attorney, Agent, or Firm* — HAYNES AND BOONE, LLP

(57) ABSTRACT

A semiconductor device according to the present disclosure includes a first transistor and a second transistor. The first transistor includes first channel members between a first and a second source/drain feature, a first gate structure wrapping around the first channel members, a first source/drain contact disposed over the first source/drain feature, and a first top gate spacer disposed between the first gate structure and the first source/drain contact. The second transistor includes second channel members between a third and a fourth source/drain features, a second gate structure wrapping around the second channel members, a second source/drain contact disposed over the third source/drain feature, and a second top gate spacer disposed between the second gate structure and the second source/drain contact. A distance between the second gate spacer and the second source/drain contact is greater than a distance between the first gate spacer and the first source/drain contact.

20 Claims, 11 Drawing Sheets

(58) Field of Classification Search
CPC ....... H01L 21/82385; H01L 21/823857; H01L 21/823871; H01L 27/0922; H01L 29/0673
USPC ........................................................ 257/401
See application file for complete search history.

(56) References Cited

U.S. PATENT DOCUMENTS

| | | |
|---|---|---|
| 9,947,804 B1 * | 4/2018 | Frougier ............... H01L 29/165 |
| 10,032,627 B2 | 7/2018 | Lee et al. |
| 10,109,721 B2 | 10/2018 | Lin |
| 10,157,799 B2 | 12/2018 | Ching |
| 10,199,502 B2 | 2/2019 | Huang |
| 10,290,546 B2 | 5/2019 | Chiang |
| 10,475,902 B2 | 11/2019 | Lee |
| 11,437,373 B2 * | 9/2022 | Liaw ................... H01L 27/0886 |
| 2015/0249036 A1 | 9/2015 | Cai |
| 2016/0111421 A1 | 4/2016 | Rodder |
| 2017/0200738 A1 | 7/2017 | Kim et al. |
| 2018/0175036 A1 | 6/2018 | Ching |
| 2018/0211959 A1 * | 7/2018 | Yu .................... H01L 29/66636 |
| 2019/0311969 A1 | 10/2019 | Liaw |
| 2020/0066839 A1 | 2/2020 | Zhang |

* cited by examiner

MULTI-GATE DEVICE STRUCTURE

PRIORITY DATA

This application is a continuation of U.S. patent application Ser. No. 16/952,684, filed Nov. 19, 2020, which claims priority to U.S. Provisional Patent Application No. 63/065,142, filed on Aug. 13, 2020, entitled "MULTI-GATE DEVICE STRUCTURE", each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Dimensional reduction facilitated by implementations of multi-gate devices also reduces spacing between gate structures and source/drain contacts, which may increase parasitic capacitance and reduce switching speed. While conventional multi-gate device structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
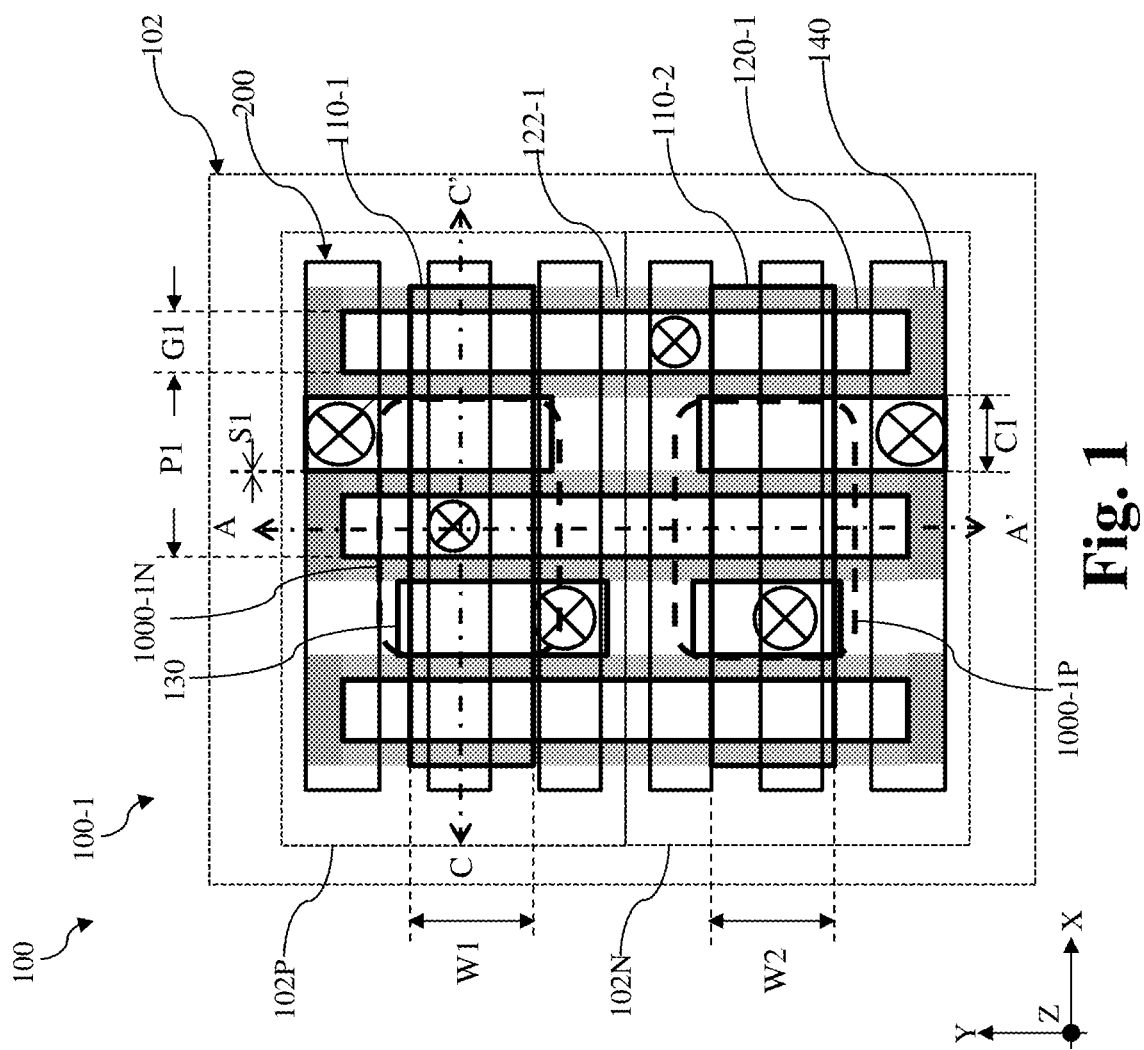
FIG. 1 illustrates a layout view of a first device area of a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors, and more particularly to source/drain contacts of multi-gate transistors.

MBC transistors allow for aggressive gate length scaling for both performance and density improvement. To meet various design needs in mobile devices, communication networks, high-performance computing (HPC), artificial intelligence (AI), virtual reality (VR), big data applications, an IC chip may include different type of devices working in synergy. These different types of the devices may include high-density devices, high-voltage devices, low-leakage devices, high-performance devices, and high-bandwidth devices. Implementing different types of MBC transistors in one chip demands a total solution, not piece-meal optimization.

The present disclosure provides embodiments of various types of MBC transistors and combination thereof for different functionalities and applications. For example, the present disclosure provides structures of a first MBC transistor that has smaller gate lengths and pitches and source/drain contacts formed using self-align contact (SAC) techniques. The present disclosure also provides structures a second MBC transistor that has larger gate lengths and pitches and non-SAC source/drain contacts. The first MBC transistor may be for high-density circuit applications. The second MBC transistor may be for high-voltage applications, such as drivers and controllers for e-fuse devices.

Figure 2:
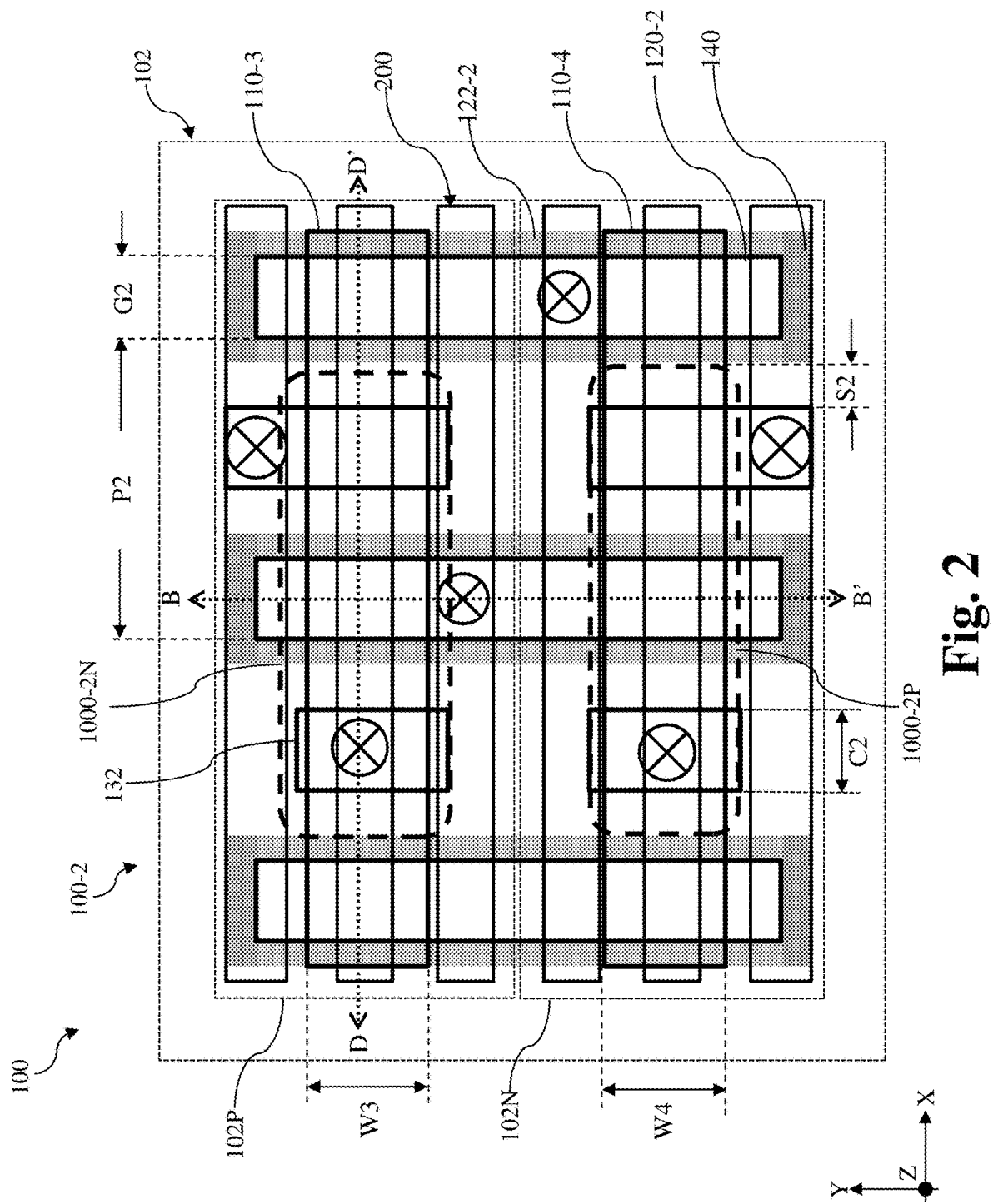
FIG. 2 illustrates a layout view of a second device area of a semiconductor device, according to various aspects of the present disclosure.
Figure 3:
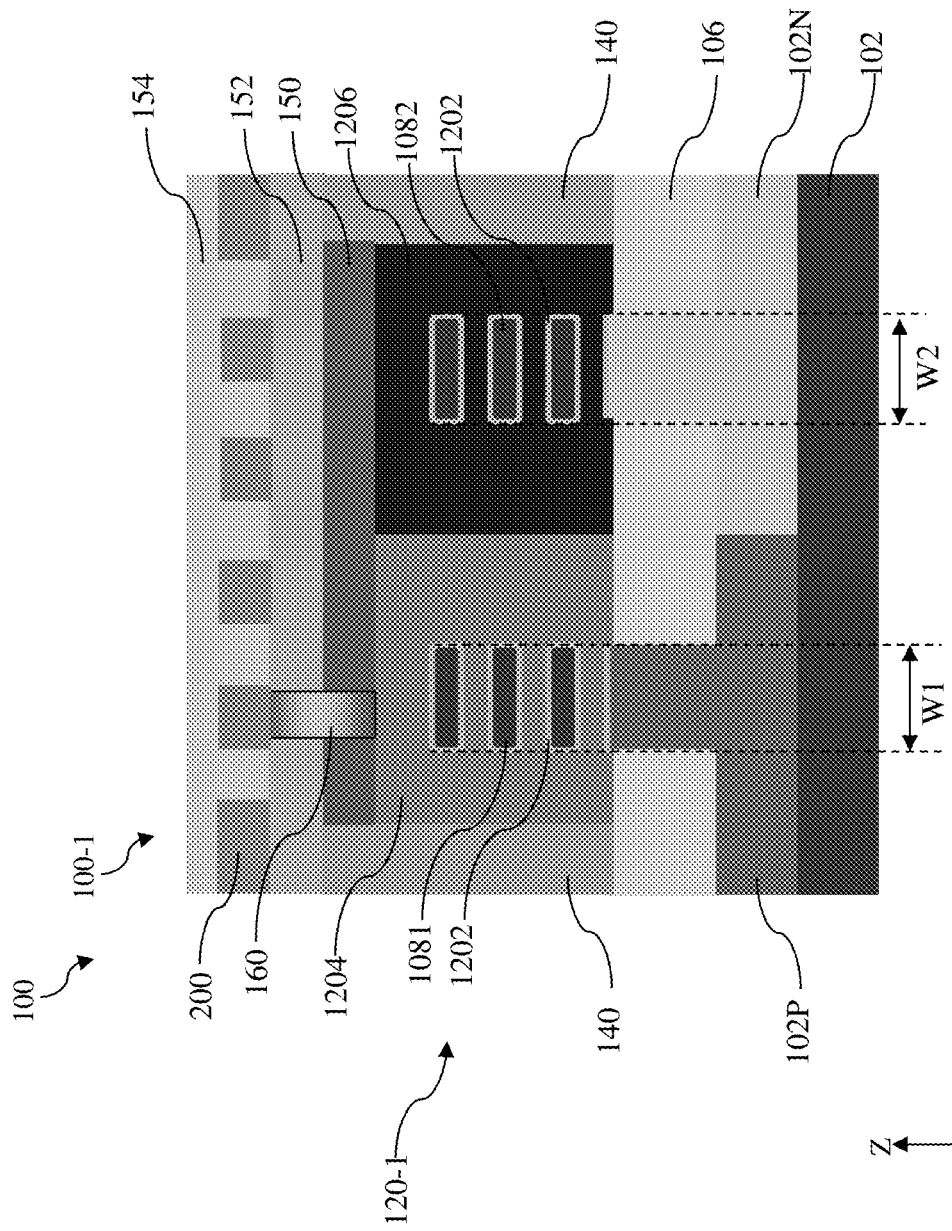
FIG. 3 illustrates a fragmentary cross-sectional view of the first device area along section A-A' in FIG. 1, according to various aspects of the present disclosure.
Figure 4:
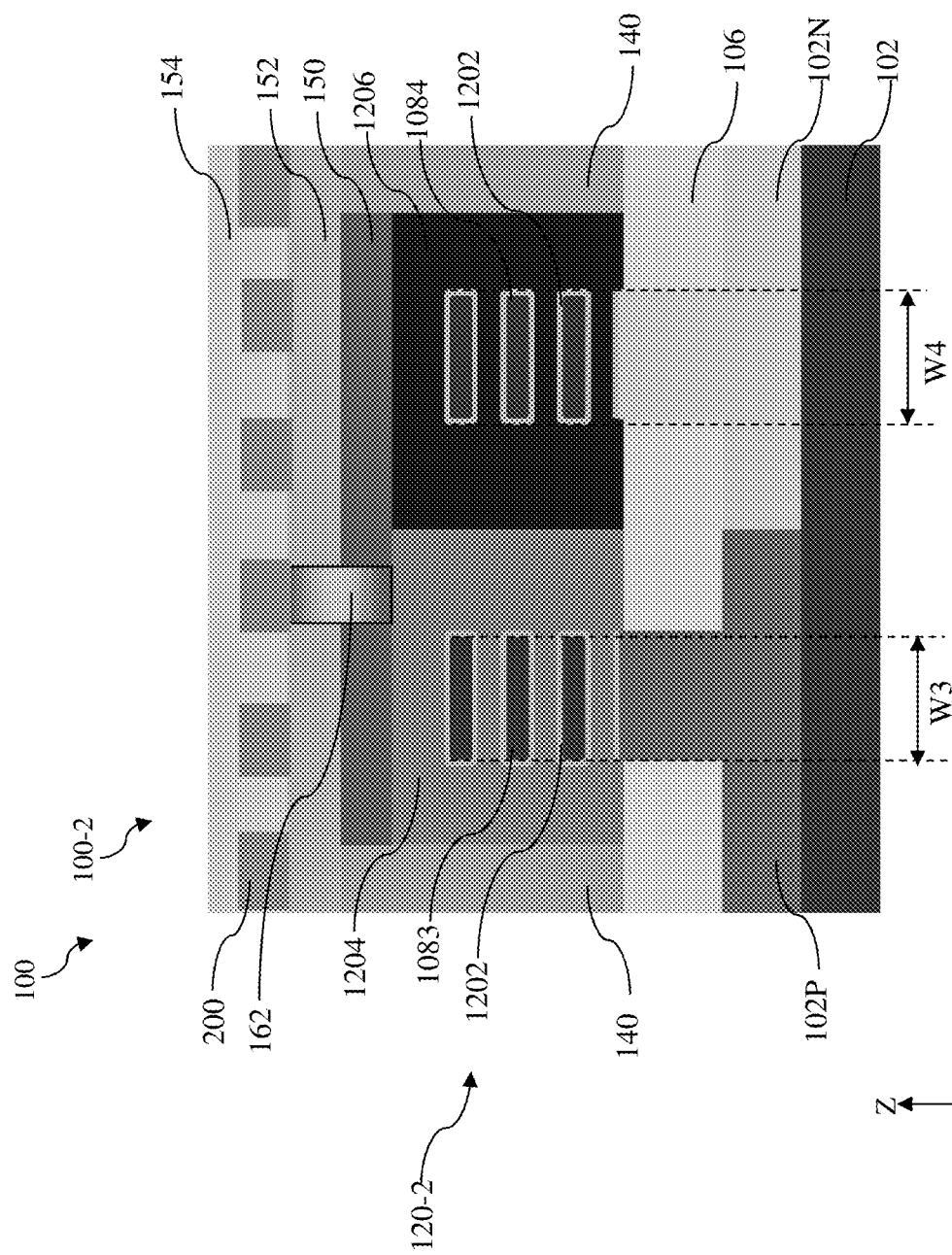
FIG. 4 illustrates a fragmentary cross-sectional view of the second device area along section B-B's in FIG. 2, according to various aspects of the present disclosure.
Figure 5:
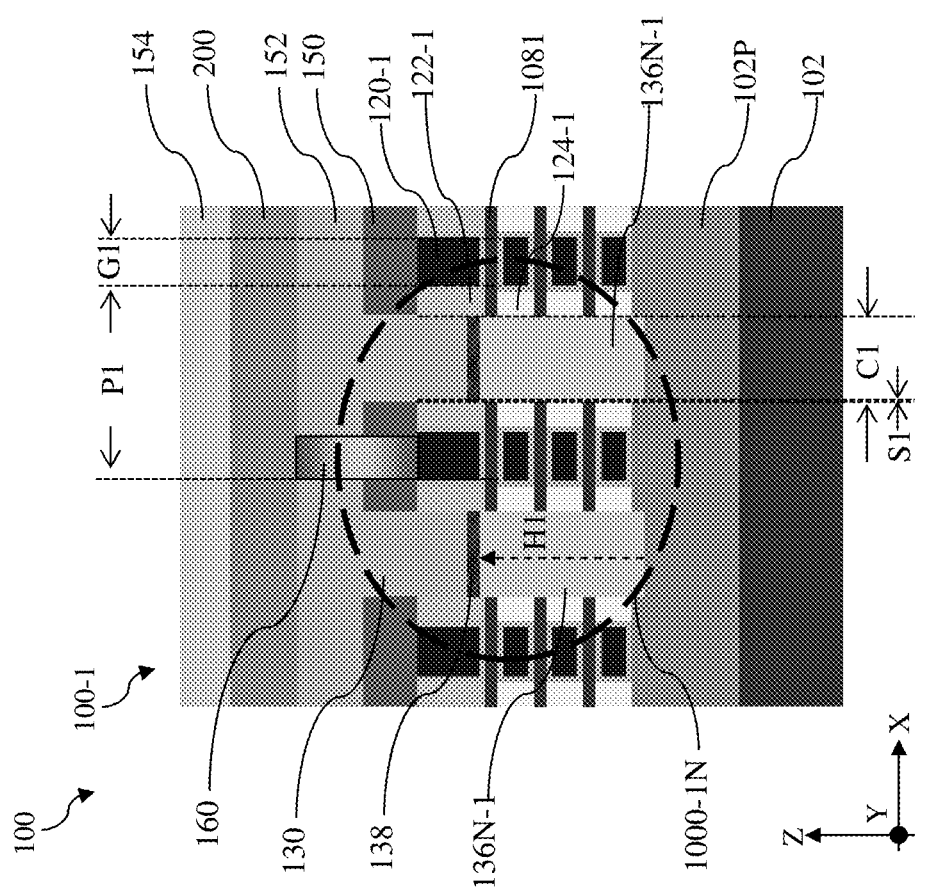
FIGS. 5 and 7 illustrate a fragmentary cross-sectional view of the first device area along section C-C' in FIG. 1, according to various aspects of the present disclosure.
Figure 6:
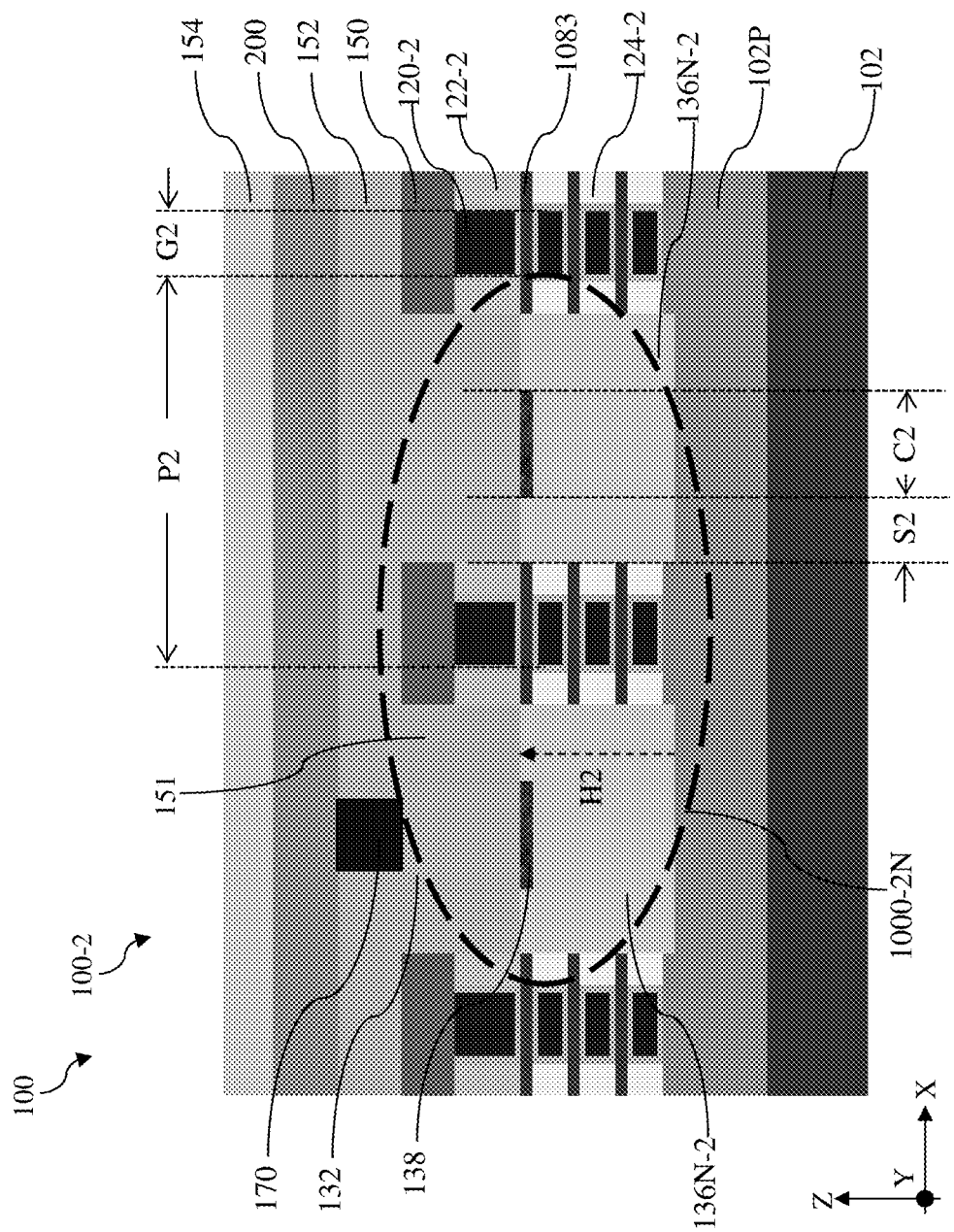
FIGS. 6 and 8 illustrates a fragmentary cross-sectional view of the second device area along section D-D's in FIG. 2, according to various aspects of the present disclosure.
Figure 7:
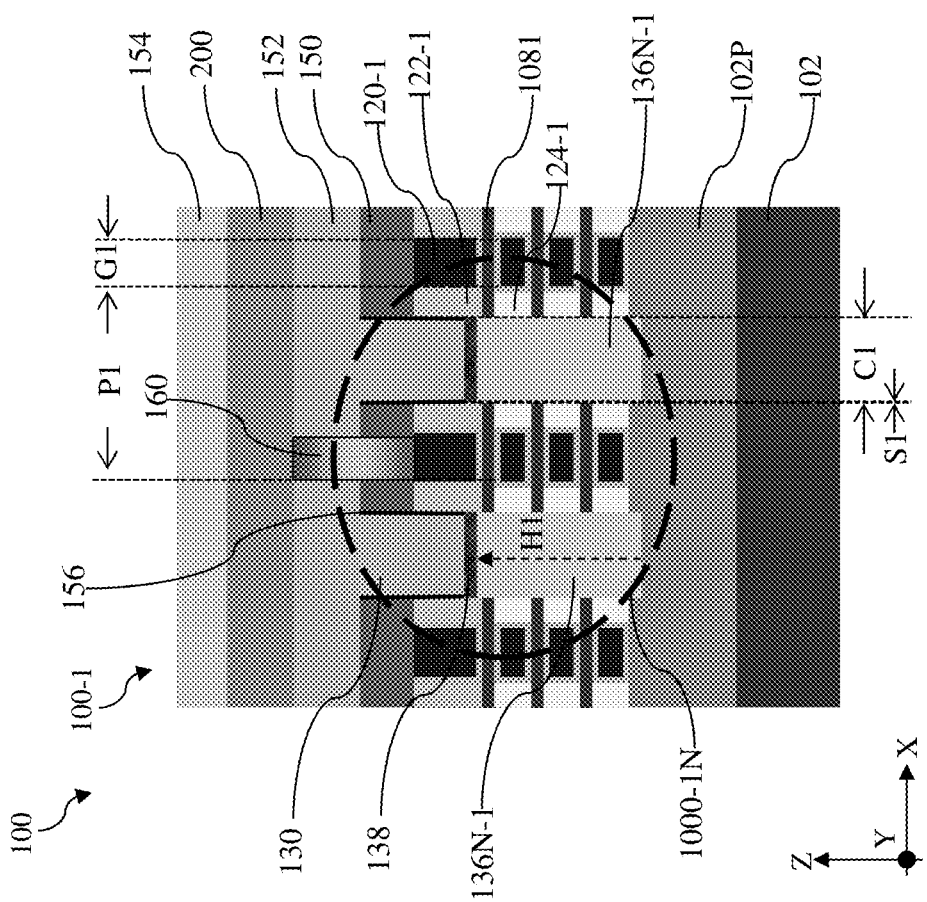
Figure 8:
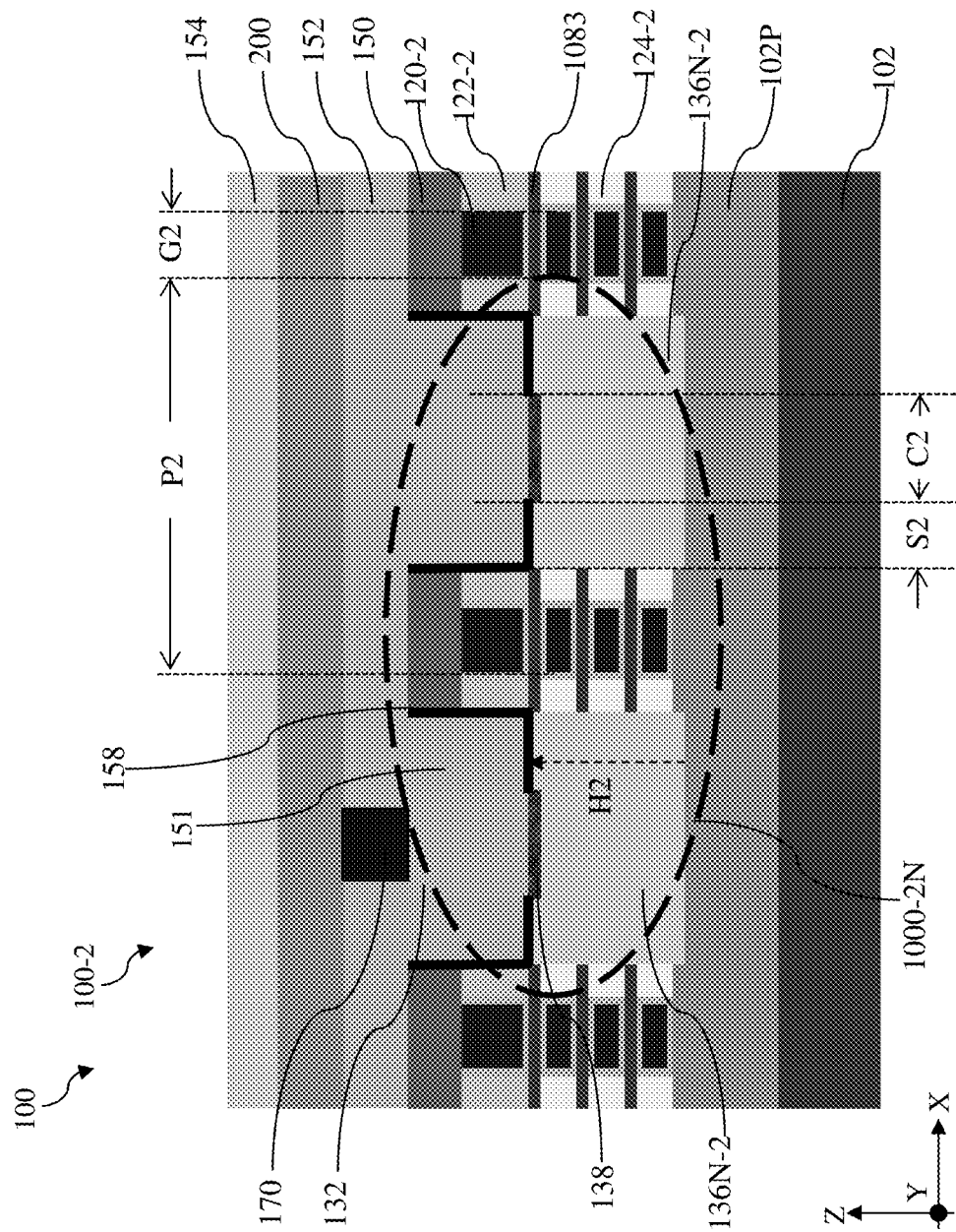
Figure 9:
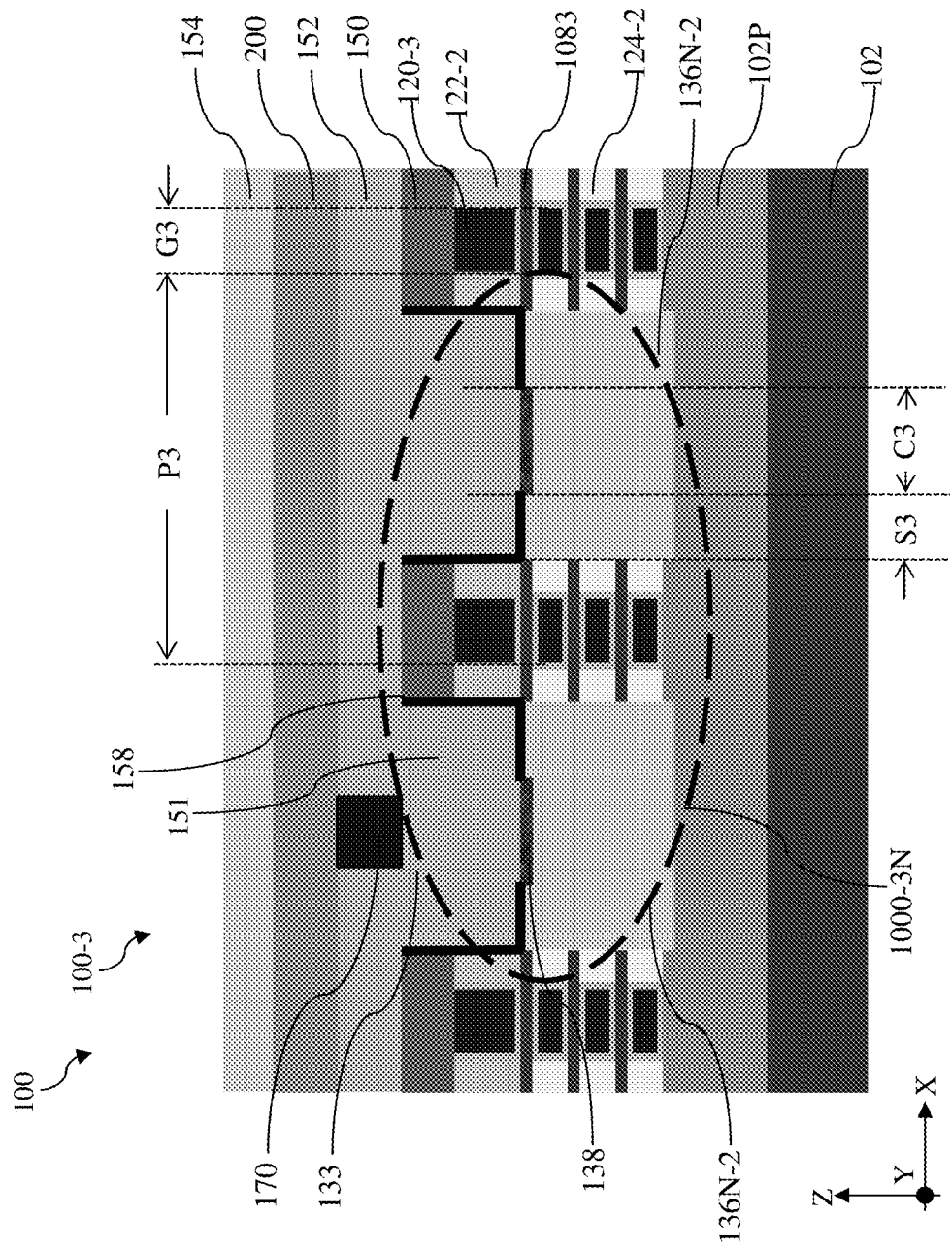
FIG. 9 illustrates a fragmentary cross-sectional view of a third device area of a semiconductor device along an active region, according to one or more aspects of the present disclosure.
Figure 10:
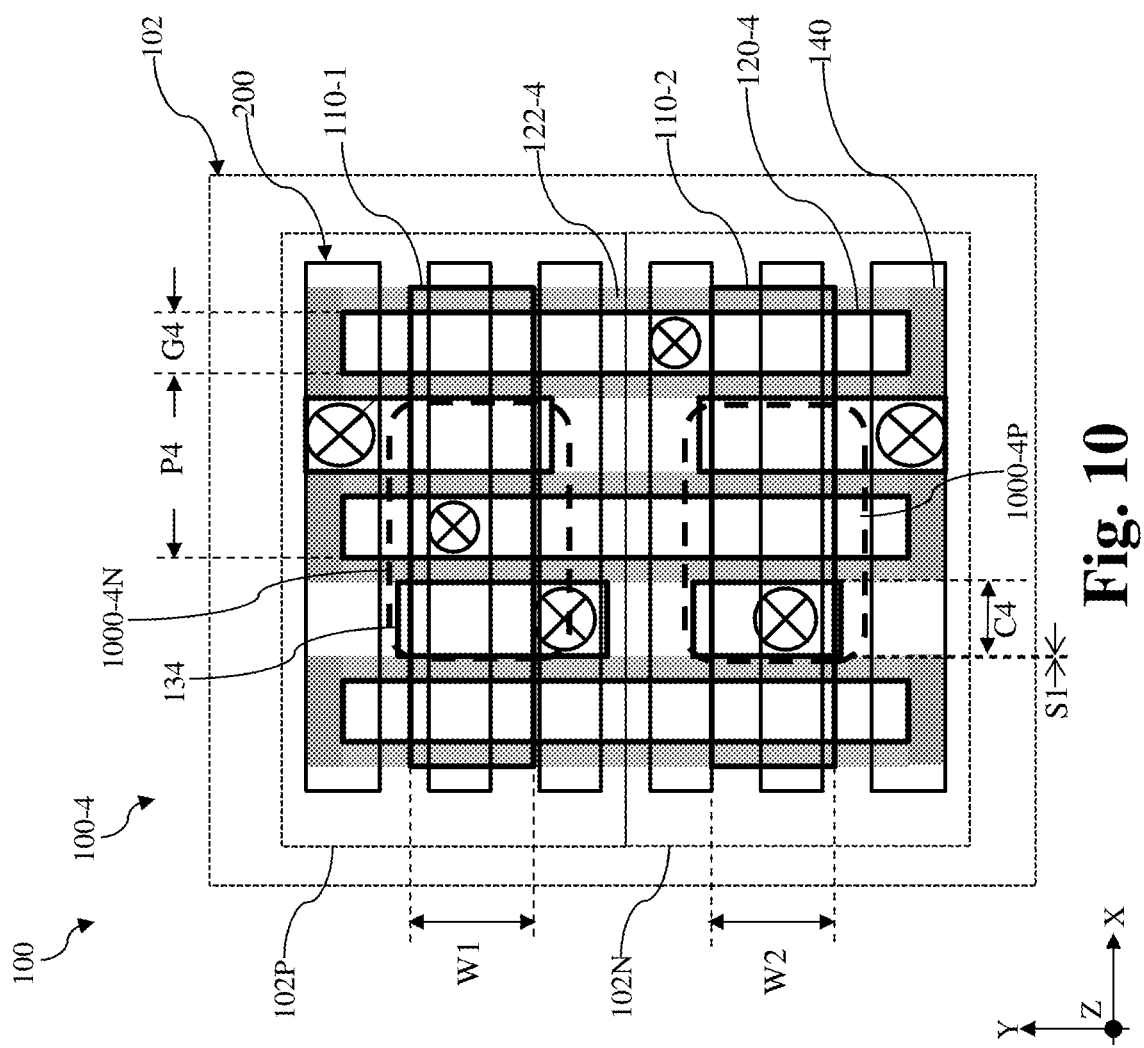
FIG. 10 illustrates a layout view of a fourth device area of a semiconductor device, according to one or more aspects of the present disclosure.
Figure 11:
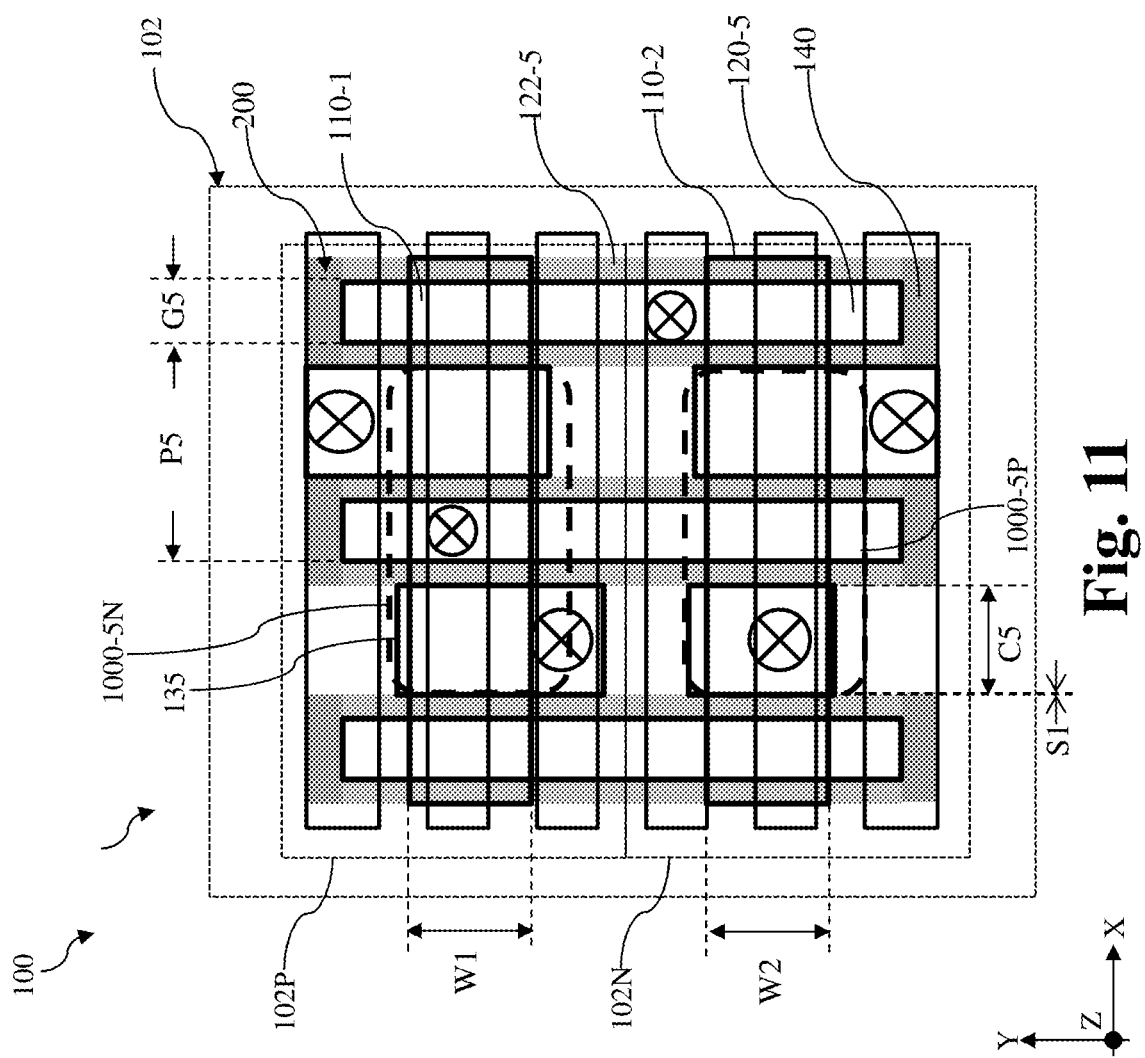
FIG. 11 illustrates a layout view of a fifth device area of a semiconductor device, according to one or more aspects of the present disclosure.

The various aspects of the present disclosure will now be described in more detail with reference to the figures. FIG. 1 illustrates a layout view of a first device area 100-1 of a semiconductor device 100. FIG. 2 illustrates a layout view of a second device area 100-2 of the semiconductor device 100. FIG. 3 illustrates a fragmentary cross-sectional view of the first device area 1001-1 along section A-A' in FIG. 1, where section A-A' cuts through a first gate structure 120-1. FIG. 4 illustrates a fragmentary cross-sectional view of the second device area 100-2 along section B-B's in FIG. 2, where section B-B' cuts through a second gate structure 120-2. FIGS. 5 and 7 illustrate a fragmentary cross-sectional view of the first device area 100-1 along section C-C' in FIG. 1, where section C-C' cuts through a first active region 110-1. FIGS. 6 and 8 illustrate a fragmentary cross-sectional view of the second device area 100-2 along section D-D' in FIG. 2, where section D-D' cuts through a third active region 110-3. FIG. 9 illustrates a fragmentary cross-sectional view of a third device area 100-3 of the semiconductor device 100 along an active region. FIG. 10 illustrates a layout view of a fourth device area 100-4 of the semiconductor device 100. FIG. 11 illustrates a layout view of a fifth device area 100-5 of the semiconductor device 100. Among FIGS. 1-11, the X direction, the Y direction, and the Z direction are perpendicular to one another and are used consistently. Additionally, throughout the present disclosure, like reference numerals are used to denote like features.

Reference is first made to FIG. 1, which illustrates a semiconductor device 100. The semiconductor device 100 includes and is fabricated on a substrate 102. In one embodiment, the substrate 102 may be a silicon (Si) substrate. In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure.

The semiconductor device 100 may include a plurality of well regions on the substrate 102. In some embodiments illustrated in FIGS. 1-4 and 10-11, the semiconductor device 100 includes an n-type well region 102N (or n-well 102N) and a p-type well region 102P (or p-well 102P) for fabrication of transistors of different conductivity types. Each of the n-well 102N and the p-well 102P is formed from the substrate 102 and includes a doping profile. The n-well 102N includes a doping profile of an n-type dopant, such as phosphorus (P) or arsenic (As). The p-well 102P includes a doping profile of a p-type dopant, such as boron (B). The doping the n-well 102N and the p-well 102P may be formed using ion implantation or thermal diffusion and may be consider portions of the substrate 102. The n-well 102N and p-well 102P are also shown in FIG. 4. As shown in FIG. 1, the first device area 100-1 includes first n-type MBC transistor 1000-1N over the p-well 102P and first p-type MBC transistor 1000-1P over the n-well 102N. In FIG. 2, the second device area 100-2 includes second n-type MBC transistor 1000-2N over the p-well 102P and second p-type MBC transistor 1000-2P over the n-well 102N. The third device area 100-3 shown in FIG. 9 includes third n-type MBC transistor 1000-3N over the p-well 102P and third p-type MBC transistor (not shown) over the n-well 102N. As illustrated in FIG. 10, the fourth device area 100-4 includes fourth n-type MBC transistor 1000-4N over the p-well 102P and fourth p-type MBC transistor 1000-4P over the n-well 102N. As illustrated in FIG. 11, the fifth device area 100-5 includes fifth n-type MBC transistor 1000-5N over the p-well 102P and fifth p-type MBC transistor 1000-5P over the n-well 102N. FIGS. 5 and 7 show the first n-type MBC transistors 1000-1N over the p-well 102P. FIGS. 6 and 8 show the second n-type MBC transistors 1000-2N over the p-well 102P.

The semiconductor device 100 may include more than one device areas, such as a first device area 100-1 shown in FIG. 1, the second device area 100-2 shown in FIG. 2, the third device area 100-3 shown in FIG. 9, a fourth device area 100-4 shown in FIG. 10, and a fifth device area 100-5 shown in FIG. 11. As used here, different device areas of the semiconductor device 100 are suitable for different applications. In some implementations, MBC transistors in the first device area 100-1 are configured to have high packing density and are suitable for high-density circuit applications; MBC transistors in the second device area 100-2 are configured to withstand high voltage and are suitable for high-voltage applications; MBC transistors in the third device area 100-3 are configured to have low parasitic capacitance and are suitable for high-frequency circuit applications; MBC transistors in the fourth device area 100-4 are suitable for low-power applications; and MBC transistors in the fifth device area 100-5 are configured to have low resistance and are suitable for high speed circuit applications. It is noted that the semiconductor device 100 may include different combinations of the device areas to meet the design requirements of different specific circuits. For example, the semiconductor device 100 may include a first device area 100-1 and a third device area 100-3 to serve as a serializer/deserializer circuit, which operate at high frequency. For another example, the semiconductor device 100 may include a first device area 100-1 and a fourth device area 100-4 (or a fifth device area 100-5) to serve as an analog or low-power circuit.

Referring back to FIG. 1, the first device area 100-1 may include one or more active regions, such as a first active region 110-1 and a second active region 110-2. Each of the first active region 110-1 and the second active region 110-2 may be formed from a fin-shaped structure patterned from a stack of semiconductor layers. Such a stack may include a plurality of channel layers interleaved by a plurality of sacrificial layers. The channel layers and the sacrificial layers may have different semiconductor compositions. In some implementations, the channel layers are formed of silicon (Si) and sacrificial layers are formed of silicon germanium (SiGe). In these implementations, the additional germanium content in the sacrificial layers allow selective removal or recess of the sacrificial layers without substantial damages to the channel layers. In some embodiments, the sacrificial layers and channel layers may be deposited using an epitaxial process, such as vapor-phase epitaxy (VPE), ultra-high vacuum CVD (UHV-CVD), or molecular beam epitaxy (MBE. Any number of sacrificial layers and channel layers can be formed in the stack to meet design needs. The first, second, third, and fourth channel members 1081, 1082, 1083, and 1084, shown in FIGS. 3-9 may be formed from the channel layers. In some embodiments, the channel members may include silicon (Si).

Referring to FIGS. 3 and 4, the active regions may be isolated from one another by an isolation feature 106. The isolation feature 106 may also be referred to as a shallow trench isolation (STI) feature 106. In some embodiments, isolation feature 106 may include silicon oxide, silicon nitride, silicon oxynitride, fluorine-doped silicate glass (FSG), a low-k dielectric, combinations thereof, and/or other suitable materials. The first gate structure 120-1 in FIGS. 1, 3, 5, and 7, the second gate structure 120-2 in FIGS. 2, 4, 6, and 8, the third gate structure 120-3 in FIG. 9, the fourth gate structure 120-4 in FIG. 10, and the fifth gate structure 120-5 in FIG. 5 may be formed using a gate replacement or gate-last process. In a gate-last process, a dummy gate stack is first formed over channel regions of the active regions as a placeholder for functional gate structures, such as the first gate structure 120-1, the second gate structure 120-2, the third gate structure 120-3, the fourth gate structure 120-4, and the fifth gate structure 120-5. The dummy gate stack includes a dummy dielectric layer and a dummy gate electrode. In some embodiments, the dummy dielectric layer includes silicon oxide and the dummy gate electrode includes polysilicon. After the dummy gate stack is formed, a gate spacer is formed along sidewalls of the dummy gate stack. Because the gate spacer is not disposed among channel members and is over the active regions, the gate spacer layer may also be referred to as top spacer or top gate spacer. The first device area 100-1 includes a first top spacer 122-1 shown in FIGS. 1, 3, 5, and 7 and the second device area 100-2 includes a second top spacer 122-2 shown in FIGS. 2, 4, 6, and 8. The third device area 100-3 also includes a first top spacer 122-1. The fourth device area 100-4 and the fifth device area 100-5 include a second top spacer 122-2. The first top spacer 122-1, the second top spacer 122-2 and the third top spacer 122-3 may include silicon oxide, silicon nitride, silicon carbide, silicon oxynitride, silicon carbonitride, silicon oxycarbide, silicon oxycarbonitride, porous oxide, and/or combinations thereof. The top spacers may include air gaps.

Gate structures, such as the first gate structure 120-1, the second gate structure 120-2, the third gate structure 120-3, the fourth gate structure 120-4, and the fifth gate structure 120-5, include a gate dielectric layer and a gate electrode. The gate dielectric layer includes an interfacial layer and a high-K dielectric layer. High-K gate dielectrics, as used and described herein, include dielectric materials having a high dielectric constant, for example, greater than that of thermal silicon oxide, which is about 3.9. The interfacial layer may include a dielectric material such as silicon oxide, hafnium silicate, or silicon oxynitride. In one embodiment, the high-K dielectric layer may include hafnium oxide. Alternatively, the high-K dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The gate electrode of the gate structure may include a single layer or alternatively, a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

In some embodiments, a gate structures may include different work function layers for n-type MBC transistors (such as the first n-type MBC transistor 1000-1N, the second n-type MBC transistor 1000-2N, the third n-type MBC transistor 1000-3N, the fourth n-type MBC transistor 1000-4N, or the fifth n-type MBC transistor 1000-5N) and p-type MBC transistors (such as the first p-type MBC transistor 1000-1P, the second p-type MBC transistor 1000-2P, the third n-type MBC transistor, the fourth p-type MBC transistor 1000-4P, or the fifth p-type MBC transistor 1000-5P). Reference is made to FIGS. 3 and 4. An n-type MBC transistor may be formed over the p-well 102P and a p-type MBC transistor may be formed over the n-well 102N. As shown in FIGS. 3 and 4, each of the first gate structure 120-1 and the second gate structure 120-2 is shared by an n-type MBC transistor and a p-type MBC transistor. To provide desirable threshold voltages for both devices, each of the first gate structure 120-1 and the second gate structure 120-2 may include two gate electrode portions. Referring first to FIG. 3, the first gate structure 120-1 includes a gate dielectric layer 1202, a first gate electrode portion 1204 over the p-well 102P and a second gate electrode portion 1206 over the n-well 102N. The first gate electrode portion 1204 includes n-type work function layers and the second gate electrode portion 1206 includes p-type work function layers. The first gate electrode portion 1204 and the second gate electrode portion 1206 have different compositions and are formed separately. Similarly, the second gate structure 120-2 includes a gate dielectric layer 1202, a first gate electrode portion 1204 over the p-well 102P and a second gate electrode portion 1206 over the n-well 102N. Along their lengthwise direction (Y direction), the gate structures may terminate in gate end dielectric features 140 shown in FIGS. 1-4 and 10-11. In some implementations, the gate end dielectric features 140 may be formed of silicon oxide, silicon nitride, silicon carbide, silicon oxynitride, silicon carbonitride, silicon oxycarbide, silicon oxycarbonitride, porous oxide, and/or combinations thereof. The gate dielectric layer 1202 may have a thickness between about 3 nm and 20 nm. In some embodiments, the gate dielectric layer 1202 has a uniform thickness in the first device area 100-1 and the second device area 100-2. In some alternative embodiments not explicitly shown in the figures, the gate dielectric layer in the second device area 100-2 is thicker than the gate dielectric layer in the first device area 100-1 by about 0.5 nm and about 3 nm.

An MBC transistor according to the present disclosure include two source/drain features, a plurality of channel members extending between the two source/drain features, and a gate structure that wraps around each of the channel members. The plurality of channel members are vertically stacked or arranged along the Z direction. For example, the first gate structure 120-1 shown in FIG. 5 wraps around the first channel members 1081 that extend between two first n-type source/drain features 136N-1 (or two first n-type features 136N-1) along the X direction. In some embodiments, the first n-type features 136N-1 include silicon doped with an n-type dopant, such as phosphorus (P) or arsenic (As). The first n-type features 136N-1 are in contact with the first channel members 1081 but are spaced apart from the first gate structure 120-1 by the first inner spacer features 124-1. The first inner spacer features 124-1 interleave the first channel members 1081. The first inner spacer features 124-1 may include silicon oxide, silicon nitride, silicon carbide, silicon oxynitride, silicon carbonitride, silicon oxycarbide, silicon oxycarbonitride, porous oxide, and/or combinations thereof. Similarly, the second gate structure 120-2 shown in FIG. 6 wraps around the third channel members 1083 that extend between two second n-type source/drain features 136N-2 (or two second n-type features 136N-2) along the X direction. In some embodiments, the second n-type features 136N-2 include silicon (Si) doped with an n-type dopant, such as phosphorus (P) or arsenic (As). The second n-type features 136N-2 are in contact with the third channel members 1083 but are spaced apart from the second gate structure 120-2 by the second inner spacer features 124-2. The second inner spacer features 124-2 interleave the third channel members 1083. The second inner spacer features 124-2 may be similar to the first inner spacer features 124-1 in terms of composition. As will be described below, the first inner spacer features 124-1 and the second inner spacer features 124-2 have different dimensions. While not explicitly shown in the figures, the first device area 100-1 includes second channel members 1082 (shown in FIG. 3) extending between two first p-type source/drain features and the second device area 100-2 includes fourth channel members 1084 (shown in FIG. 4) extending between two p-type source/drain features. The p-type source/drain features may include silicon germanium (SiGe) doped with a p-type dopant, such as boron (B).

The first device area 100-1, the second device area 100-2, the third device area 100-3, the fourth device area 100-4, and the fifth device area 100-5 include source/drain contacts that are electrically coupled to the source/drain features. During the fabrication of MBC transistors, after the source/drain features are formed to couple to the channel members. An interlayer dielectric (ILD) layer may be deposited over the source/drain features. In some embodiments, in order to control the etching of the source/drain contact openings, a contact etch stop layer (CESL) is deposited over the source/drain features before the deposition of the ILD layer. The source/drain contact may be formed using a self-aligned contact (SAC) process or a non-SAC process. In a SAC process, a source/drain contact opening is defined in an area surrounded by dielectric layers of a different etch selectivity. In a non-SAC process, a source/drain contact opening is defined solely by a photolithography process. Therefore, the SAC process is less dependent upon overlay of photomasks while the non-SAC process relies on satisfactory overlay of photomasks. An example SAC process includes use of a SAC dielectric layer, such as the gate SAC dielectric layer 150 shown in FIGS. 3-9. As will be described below, when SAC source/drain contacts and non-SAC source/drain contacts are formed on the same substrate, SAC dielectric layers may exist when non-SAC processes are used to form some source/drain contacts. A SAC process reduces spacing (i.e. distance) between a gate structure and a source/drain contact and is suitable for forming contact structures for high-density circuit applications where gate pitches are tight. A non-SAC process increases spacing (i.e. distance) between a gate structure and a source/drain contact and is suitable for applications where gate-to-contact capacitance and contact-to-gate breakdown voltage are undesirable.

Source/drain contacts formed using SAC processes are illustrated in FIGS. 1, 5, 7, 10, and 11 while source/drain contacts formed using non-SAC processes are illustrated in FIGS. 2, 6, 8, and 9. Referring to FIGS. 1, 5, and 7, a first source/drain contact 130 is formed using a SAC process. In embodiments represented in FIGS. 1 and 5 where a CESL is not formed, the first source/drain contact 130 is sandwiched between two first top spacers 122-1 as well as between two gate SAC dielectric layers 150. That is, the first source/drain contact 130 is in direct contact with the gate SAC dielectric layers 150 and the first top spacers 122-1. In embodiments represented in FIG. 7 where a first CESL 156 is formed over the first n-type source/drain feature 136N-1, the first CESL 156 is disposed between the first source/drain contact 130 and the gate SAC dielectric layer 150 as well as between the first source/drain contact 130 and the first top spacer 122-1. In some embodiments, the first CESL 156 may include silicon nitride. Similarly, as shown in FIGS. 10 and 11, the fourth source/drain contact 134 and the fifth source/drain contact 135 may be in contact with the first top spacers 122-1, either directly or indirectly by way of a CESL (not shown). As shown in FIGS. 3-9, the source/drain contacts are coupled the source/drain features through a silicide layer 138. In some embodiments, the silicide layer may include titanium silicide, cobalt silicide, or nickel silicide.

In embodiments represented in FIGS. 2, 6, and 8, a second source/drain contact 132 extends through a first ILD layer 151 disposed between two second top spacers 122-2 as well as between two gate SAC dielectric layers 150. That is, the second source/drain contact 132 is spaced apart from the second top spacer 122-2 by the first ILD layer 151. In embodiments represented in FIG. 8 where a second CESL 158 is formed over the second n-type source/drain feature 136N-2, the second CESL 158 is disposed between the first ILD layer 151 and the gate SAC dielectric layer 150 as well as between the first ILD layer 151 and the second top spacer 122-2. Like the first CESL 156, the second CESL 158 may include silicon nitride. The first ILD layer 151 may include low-k dielectric materials, such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), or the like. Similarly, as shown in FIG. 9, the third source/drain contact 133 is spaced apart from the gate SAC dielectric layer 150 and the second top spacer 122-2 by the first ILD layer 151 and the second CESL 158. In some embodiments not explicitly shown, the third source/drain contact 133 may be spaced apart from the gate SAC dielectric layer 150 and the second top spacer 122-2 solely by the first ILD layer 151, when the second CESL 158 is not formed.

While the first CESL 156 and the second CESL 158 may have the same thickness when they are first deposited, the first CESL 156 and the second CESL 158 have different thicknesses in the final structure due to different source/drain contact formation processes. The first CESL 156 is subject to an etch process in the SAC process while the second CESL 158 is not subject to any etch process in the non-SAC process. As a result, a thickness of the second CESL 158 is greater than a thickness of the first CESL 156. In some embodiments, the first CESL 156 may have a thickness along the X direction between about 0.2 nm and about 3 nm. In some implementations, the second CESL 158 may have a thickness along the X direction between about 1.2 nm and about 5 nm.

Gate contact vias electrically couple the gate structures to a metal layer. In FIG. 3, a first gate contact via 160 extends from the first gate structure 120-1 through the gate SAC dielectric layer 150, a second ILD layer 152 to couple to metal lines in a first metal layer 200, which includes an intermetal dielectric (IMD) layer 154 that enclose the metal lines. Similarly, a second gate contact via 162 extends from the second gate structure 120-2 through the gate SAC dielectric layer 150, the second ILD layer 152 to couple to the metal lines in the first metal layer 200. The second ILD layer 152 and the IMD layer 154 may have a composition similar to that of the first ILD layer 151. The first source/drain contact 130, the second source/drain contact 132, the first gate contact via 160, the second gate contact via 162, and the first metal layer 200 may include titanium (Ti), titanium nitride (TiN), tantalum nitride (TaN), platinum (Pt), copper (Cu), aluminum (Al), ruthenium (Ru), tungsten (W), nickel (Ni), cobalt (Co), or a combination thereof. In some embodiments, the first source/drain contact 130, the second source/drain contact 132, the first gate contact via 160, the second gate contact via 162, and the first metal layer 200 may include a liner or a barrier layer formed of a metal nitride, such as titanium nitride.

MBC device structures in the first device area 100-1, the second device area 100-2, the third device area 100-3, the fourth device area 100-4, and the fifth device area 100-5 are further described in conjunction with FIGS. 1-11. Reference is made to FIG. 1 again. The first device area 100-1 includes first source/drain contacts 130 that are formed using a SAC process. With the first source/drain contacts 130 in contact with the first top spacer 122-1, the first spacing S1 between the first source/drain contact 130 and the first top spacer 122-1 is substantially zero. Each of the first gate structures 120-1 extends lengthwise along the Y direction and has a first gate length G1. Additionally, the first gate structures 120-1 in the first device area 100-1 have a first pitch P1. The second device area 100-2 in FIG. 2 includes second source/drain contacts 132 that are formed using a non-SAC process. With the presence of the first ILD layer 151 interposing the second top spacer 122-2 and the second source/drain contact 132, the second spacing S2 between the second source/drain contact 132 and the second top spacer 122-2 is greater than 5 nm, such as between about 5 nm and about 50 nm. Because the first spacing S1 is substantially zero, a difference between the second spacing S2 and the first spacing S1 may be between about 5 nm and about 50 nm. In addition, because the MBC transistors in the second device area 100-2 are for high-voltage circuit applications, the second gate length G2 of the second gate structure 120-2 is greater than the first gate length G1 of the first gate structure 120-1. In some instances, the second gate length G2 is about 1.2 to about 5 times of the first gate length G1. The presence of the first ILD layer 151 between the second top spacer 122-2 and the second source/drain contact 132 also allows the second pitch P2 to be about 1.4 times to about 4 times of the first pitch P1. The greater second spacing S2 and the present of the low-k first ILD layer 151 help reduce the gate-to-contact leakage or parasitic capacitance between the second gate structure 120-2 and the second source/drain contact 132. FIGS. 7 and 8 illustrate embodiments where the first CESL 156 and the second CESL 158 are formed. As described above, because the second CESL 158 disposed along sidewalls of the second top spacer 122-2 are not etched, the second CESL 158 has a thickness greater than that of the first CESL 156.

Moreover, the non-SAC source/drain contact may be greater than the SAC source/drain contact to reduce resistor-capacitor (RC) delay. For example, the second source/drain contacts 132 shown in FIGS. 2, 6 and 8 have a second contact dimension C2 that is greater than a first contact dimension C1 of the first source/drain contacts 130 shown in FIGS. 1, 5 and 7. In some implementations, a ratio of the second contact dimension C2 to the first contact dimension C1 (C2/C1) is between about 1.2 and about 3. The greater second contact dimension C2 allows larger source/drain contact vias, which may result in reduced resistance. For example, the source/drain contact via 170 over the second source/drain contact 132 may gain dimensions along the X direction as the second source/drain contact 132 has a greater second contact dimension C2. In some embodiments, as compared to the smaller first contact dimension C1, the larger second contact dimension C2 allows enlargement of source/drain contact via 170 by about 1.2 to about 4 times in terms of width or diameter (if circular). To improve gate-to-contact breakdown voltage for high voltage applications, the second top spacer 122-2 in the second device area 100-2 is thicker than the first top spacer 122-1 in the first device area 100-1 and the second inner spacer feature 124-2 in the second device area 100-2 is thicker than the first inner spacer feature 124-1 in the first device area 100-1 along the X direction. In some instances, the difference between the thickness of the second top spacer 122-2 and the thickness of the first top spacer 122-1 is between about 0.5 nm and 5 nm. The first top spacer feature 122-1 may have a thickness between about 3 nm and about 12 nm. In some instances, the difference between the thickness of the second inner spacer feature 124-2 and the thickness of the first inner spacer feature 124-1 is between about 0.5 nm and 5 nm. The first inner spacer feature 124-1 may have a thickness between about 3 nm and about 12 nm. The greater second spacing S2 and the greater second contact dimension C2 naturally lead to a wider source/drain feature along the X direction. For example, a width of the second n-type source/drain feature 136N-2 is greater than a width of the first n-type source/drain feature 136N-1.

In some embodiments, the height of the source/drain features along the Z direction may be different depending on the formation process of the source/drain contacts. When a SAC process is used to form the first source/drain contact 130 as illustrated in FIGS. 5 and 7, the first n-type source/drain feature 136N-1 has a first height H1. When a non-SAC process is used to form the second source/drain contact 132 as illustrated in FIGS. 6 and 8, the first n-type source/drain feature 136N-1 has a second height H2. To accommodate the SAC process, the first n-type source/drain feature 136N-1 is deposited until it is higher than the topmost first channel member 1081 to reduce the aspect ratio when forming the contact opening for the first source/drain contact 130. On the contrary, the second n-type source/drain feature 136N-2 may be coplanar or lower than the topmost third channel member 1083 to improve source/drain-to-gate breakdown voltage. In these embodiments, the first height H1 is greater than second height H2.

Reference is made to FIGS. 3 and 4. To accommodate the lower hole mobility in the channel members and to provide improved complimentary metal-oxide-semiconductor (CMOS) transistor performance, the first channel members 1081, the second channel members 1082, the third channel members 1083, and the fourth channel members 1084 may have different channel widths along the Y direction. As shown in FIG. 3, in the first device area 100-1, each of the first channel members 1081 may have a first channel width W1 and each of the second channel members 1082 may have a second channel width W2. In some embodiments, the second channel width W2 for the p-type MBC transistor over the n-well 102N is greater than the first channel width W1 for the n-type MBC transistor over the p-well 102P. In some instances, a ratio of the second channel width W2 and the first channel width W1 (W2/W1) is between about 1.05 and about 2. The lower bound of this range accounts for process variation of about 5%. It means that a W2/W1 ratio between 1 and 1.05 may not indicate that the second channel width W2 is intended to be greater than the first channel width W1. This W2/W1 ratio may not exceed about 2 because such a width difference may require substantial over-etch to release the channel members having the second channel width W2 and such over-etch may undesirably reduce the thickness of the channel members having the first channel width W1. As shown in FIG. 4, in the first device area 100-1, each of the third channel members 1083 may have a third channel width W3 and each of the fourth channel members 1084 may have a fourth channel width W4.

In some embodiments, the fourth channel width W4 for the p-type MBC transistor over the n-well 102N is greater than the third channel width W3 for the n-type MBC transistor over the p-well 102P. In some instances, a ratio of the fourth channel width W4 and the third channel width W3 (W4/W3) is between about 1.05 and about 2. The lower bound of this range accounts for process variation of about 5%. It means that a W4/W3 ratio between 1 and 1.05 may not indicate that the fourth channel width W4 is intended to be greater than the third channel width W3. This W4/W3 ratio may not exceed about 2 because such a width difference may require substantial over-etch to release the channel members having the fourth channel width W4 and such over-etch may undesirably reduce the thickness of the channel members having the third channel width W3. Moreover, channel widths for the second device area 100-2 may be equal or greater than the first device area 100-1 to accommodate greater drive current associated with the high-voltage applications. In some instances, a ratio of the third channel width W3 to the first channel width W1 may be between about 1 and about 3. In some instances, a ratio of the fourth channel width W4 to the second channel width W2 may be between about 1 and about 3. The channel thickness and channel-to-channel spacing along the Z direction for the first channel members 1081, the second channel members 1082, the third channel members 1083, and the fourth channel members 1084 may be substantially the same.

MBC transistors in the first device area 100-1 or in the second device area 100-2 may be used with MBC transistors of different structures in a third device area 100-3 shown in FIG. 9, a fourth device area 100-4 shown in FIG. 10, or a fifth device area 100-5 shown in FIG. 11. For ease of references, MBC transistors in the first device area 100-1 may be referred to as first MBC transistors, MBC transistors in the second device area 100-2 may be referred to as second MBC transistors, MBC transistors in the third device area 100-3 may be referred to as third MBC transistors, MBC transistors in the fourth device area 100-4 may be referred to as fourth MBC transistors, and MBC transistors in the fifth device area 100-5 may be referred to as fifth MBC transistors. As described above, the first, second, third, fourth, and fifth MBC transistors may be n-type or p-type.

Reference is now made to FIG. 9, which illustrates a layout view of the third device area 100-3. The third MBC transistors in the third device area 100-3 are for high-frequency circuit application that is sensitive to parasitic capacitance between gate structures and source/drain contacts. As shown in FIG. 9, the third MBC transistor includes third channel members 1083 extending between two second n-type source/drain features 136N-2. A third gate structure 120-3 wraps around each of the third channel members 1083. A third source/drain contact 133 is disposed over the second n-type source/drain feature 136N-2. The third source/drain contact 133 is formed using a non-SAC process and is spaced apart from the third gate structure 120-3 by a third spacing S3. The third source/drain contact 133 has a third contact dimension C3 along the X direction. The third gate structures 120-3 have a third gate length G3 and a third pitch P3. As the third MBC transistors are not for high-voltage applications, the third gate length G3 is smaller than the second gate length G2 and may be similar to the first gate length G1. In some instances, a ratio of the second gate length G2 to the third gate length G3 may be between 1.2 and about 2. To increase gate-to-contact spacing, the third pitch P3 may be similar to the second pitch P2. The third spacing S3 may be similar to the second spacing S2. In some instances, the third spacing S3 is greater than 5 nm, such as between about 5 nm and about 50 nm. The third contact dimension C3 is greater than the first contact dimension C1. In some implementations, a ratio of the third contact dimension C3 to the first contact dimension C1 may be greater than 1.4, such as between about 1.4 and about 2.

As shown in FIG. 10, the fourth MBC transistor includes a fourth gate structure 120-4 disposed between two fourth source/drain contacts 134. The fourth source/drain contact 134 is formed using a SAC process and comes in contact with a fourth top spacer 122-4. That is, the fourth source/drain contact 134 is spaced apart from the fourth top spacer 122-4 by the first spacing S1, which is substantially zero. The fourth source/drain contact 134 has a fourth contact dimension C4 along the X direction. The fourth gate structures 120-4 have a fourth gate length G4 and a fourth pitch P4. The fourth MBC transistors are for low-power circuit applications. The fourth gate length G4 is greater than the first gate length G1. In some embodiments, a ratio of the fourth gate length G4 to a first gate length G1 may be between about 1.1 and about 1.5. Similarly, a ratio of the fourth pitch P4 to the first pitch P1 may be between about 1.1 and 1.5. When the ratio of the fourth pitch P4 to the first pitch P1 is smaller than 1.1 (i.e., a 10% difference), the gain of source cutoff current (Isoff) may be minor and does not justify implementing different gate pitches. When the ratio of the fourth pitch P4 to the first pitch P1 is greater than 1.5, the On-state current (Ion) may degrade too much to meet design requirements for advance device nodes. The fourth top spacer 122-4 may be similar to the first top spacer 122-1.

As shown in FIG. 11, the fifth MBC transistor includes a fifth gate structure 120-5 disposed between two fifth source/drain contacts 135. The fifth source/drain contact 135 is formed using a SAC process and comes in contact with a fifth top spacer 122-5. That is, the fifth source/drain contact 135 is spaced apart from the fifth top spacer 122-5 by the first spacing S1, which is substantially zero. The fifth source/drain contact 135 has a fifth contact dimension C5 along the X direction. The fifth gate structures 120-5 have a fifth gate length G5 and a fifth pitch P5. The fifth MBC transistors are for high speed circuit applications. The fifth gate length G5 may be similar to the first gate length G1. Similarly, a ratio of the fifth pitch P5 to the first pitch P1 may be between about 1.1 and 1.5. When the ratio of the fifth pitch P5 to the first pitch P1 is smaller than 1.1 (i.e., a 10% difference), the gain of source cutoff current (Isoff) may be minor and does not justify implementing different gate pitches. When the ratio of the fifth pitch P5 to the first pitch P1 is greater than 1.5, the On-state current (Ion) may degrade too much to meet design requirements for advance device nodes.

In some embodiments, the semiconductor device 100 may include first MBC transistors in the first device area 100-1 and third MBC transistors in the third device area 100-3 to serve as a serializer/deserializer circuit, which operate at high frequency. In some other embodiments, the semiconductor device 100 may include first MBC transistors in the first device area 100-1 and fourth MBC transistors in the fourth device area 100-4 (or the fifth MBC transistors in the fifth device area 100-5) to serve as an analog or low-power circuit.

Although not intended to be limiting, one or more embodiments of the present disclosure provide many benefits to a semiconductor device and the formation thereof. For example, the present disclosure provides structures of a first MBC transistor that has smaller gate lengths and pitches and source/drain contacts formed using a self-align contact (SAC) process and a second MBC transistor that has larger gate lengths and pitches and non-SAC source/drain contacts. The first MBC transistors allow for dense packing, suitable for high-density circuit applications. The second MBC transistors have greater gate-to-contact spacing to improve breakdown voltage and parasitic capacitance, suitable for high voltage applications, such as drivers and controllers for e-fuse devices. The present disclosure also provides third MBC transistors suitable for high-frequency applications, fourth MBC transistors suitable for low-power applications, and fifth MBC transistors suitable for high-speed application.

In one exemplary aspect, the present disclosure is directed to a semiconductor device. The semiconductor device includes a first transistor in a first device area of a substrate and a second transistor in a second device area of the substrate. The first transistor includes a first source/drain feature and a second source/drain feature, a first plurality of channel members sandwiched between the first source/drain feature and the second source/drain feature, a first gate structure wrapping around each of the first plurality of channel members, a first source/drain contact disposed over the first source/drain feature, and a first top gate spacer disposed between the first gate structure and the first source/drain contact. The second transistor includes a third source/drain feature and a fourth source/drain feature, a second plurality of channel members sandwiched between the third source/drain feature and the fourth source/drain feature, a second gate structure wrapping around each of the second plurality of channel members, a second source/drain contact disposed over the third source/drain feature, and a second top gate spacer disposed between the second gate structure and the second source/drain contact. A distance between the second top gate spacer and the second source/drain contact is greater than a distance between the first top gate spacer and the first source/drain contact.

In some embodiments, each of the first plurality of channel members extends along a first direction, each of the second plurality of channel members extends along a second direction, the first top gate spacer has a first thickness along the first direction, the second top gate spacer has a second thickness along the second direction, and the second thickness is greater than the first thickness. In some implementations, the first transistor further includes a first etch stop layer disposed between the first source/drain contact and the first top gate spacer and the second transistor further includes a second etch stop layer and a low-k dielectric layer disposed between the second source/drain contact and second top gate spacer. In some instances, the first etch stop layer is in direct contact with the first source/drain contact and the first top gate spacer. In some embodiments, the second etch stop layer is in direct contact with the second top gate spacer and the low-k dielectric layer. In some embodiments, a thickness of the first etch stop layer is smaller than a thickness of the second etch stop layer. In some instances, the first etch stop layer and the second etch stop layer include silicon nitride and the low-k dielectric layer includes silicon oxide. In some implementations, the first device area is a high-density device area and the second device area is a high-voltage device area. In some embodiments, the first gate structure includes a first gate length and the second gate structure includes a second gate length greater than the first gate length.

In another exemplary aspect, the present disclosure is directed to a semiconductor device. The semiconductor device includes a first transistor and a second transistor. The first transistor includes a first source/drain feature and a second source/drain feature, a first plurality of channel members sandwiched between the first source/drain feature and the second source/drain feature along a first direction, a first gate structure wrapping around each of the first plurality of channel members, and a first plurality of inner spacer features disposed between the first gate structure and the first source/drain feature. The second transistor includes a third source/drain feature and a fourth source/drain feature, a second plurality of channel members sandwiched between the third source/drain feature and the fourth source/drain feature along a second direction, a second gate structure wrapping around each of the second plurality of channel members, and a second plurality of inner spacer features disposed between the second gate structure and the third source/drain feature. Each of the first plurality of inner spacer features has a first thickness along the first direction, each of the second plurality of inner spacer features has a second thickness along the second direction, and the second thickness is greater than the first thickness.

In some embodiments, the first plurality of channel members are interleaved by the first plurality of inner spacer features. In some instances, a width of the first source/drain feature along the first direction is smaller than a width of the third source/drain feature along the second direction. In some implementations, the first transistor may further include a first source/drain contact over the first source/drain feature, and a first top spacer disposed along sidewalls of the first gate structure above the first plurality of channel members. The second transistor may further include a second source/drain contact over the third source/drain feature, and a second top spacer disposed along sidewalls of the second gate structure above the second plurality of channel members. A distance between the first source/drain contact and the first top spacer is smaller than a distance between the second source/drain contact and the second top spacer. In some embodiments, the first source/drain contact includes a third width (W3) along the first direction, the second source/drain contact includes a fourth width (W4) along the second direction, and the fourth width (W4) is greater than the third width (W3). In some instances, a ratio of the fourth width to the third width (W4/W3) is between about 1.2 and 3.0.

In yet another exemplary aspect, the present disclosure is directed to a semiconductor device. The semiconductor device includes a high-density transistor and a high-voltage transistor. The high-density transistor includes a first gate structure and a second gate structure defining a first pitch, and a first source/drain contact disposed between the first gate structure and the second gate structure along a first direction. The high-voltage transistor includes a third gate structure and a fourth gate structure defining a second pitch greater than the first pitch, and a second source/drain contact disposed between the third gate structure and the fourth gate structure along a second direction. The first source/drain contact is spaced apart from the first gate structure by a first distance. The second source/drain contact is spaced apart from the third gate structure by a second distance greater than the first distance.

In some embodiments, the high-density transistor further includes a first contact via over the first source/drain contact, the high-voltage transistor further includes a second contact via over the second source/drain contact, and a width of the first contact via along the first direction is smaller than a width of the second contact via along the second direction. In some implementations, the semiconductor device may further include a substrate and the high-density transistor further includes a first plurality of channel members stacking along a third direction away from the substrate, and a first source/drain feature in contact with the first plurality of channel members. In some instances, the high-voltage transistor further includes a second plurality of channel members stacking along the third direction, and a second source/drain feature in contact with the second plurality of channel members. The first source/drain feature is higher than a topmost channel member of the first plurality of channel members along the third direction. The second source/drain feature is substantially flush with a topmost channel member of the second plurality of channel members along the third direction. In some instances, the high-density transistor further includes a first etch stop layer disposed between the first source/drain contact and the first gate structure, the high-voltage transistor further includes a second etch stop layer disposed between the second source/drain contact and the third gate structure, and a thickness of the second etch stop layer along the second direction is greater than a thickness of the first etch stop layer along the first direction. In some instances, the first etch stop layer is in contact with the first source/drain contact and the second etch stop layer is spaced apart from the second source/drain contact by an interlayer dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a first transistor comprising:
  a first source/drain feature and a second source/drain feature,
  a first plurality of channel members sandwiched between the first source/drain feature and the second source/drain feature along a first direction, and
  a first gate structure wrapping around each of the first plurality of channel members; and
 a second transistor comprising:
  a third source/drain feature and a fourth source/drain feature,
  a second plurality of channel members sandwiched between the third source/drain feature and the fourth source/drain feature along the first direction, and
  a second gate structure wrapping around each of the second plurality of channel members,
 wherein a height of the first source/drain feature is greater than a height of the second source/drain feature,
 wherein the first source/drain feature and the second source/drain feature comprise a first width along the first direction,
 wherein the third source/drain feature and the fourth source/drain feature comprises a second width along the first direction,
 wherein the second width is greater than the first width.

2. The semiconductor device of claim 1,
 wherein the first plurality of channel members are stacked vertically one over another,
 wherein the second plurality of channel members are stacked vertically one over another.

3. The semiconductor device of claim 1, further comprising:
 a first gate spacer disposed along the first gate structure and above a topmost one of the first plurality of channel members; and
 a second gate spacer disposed along the second gate structure and above a topmost one of the second plurality of channel members.

4. The semiconductor device of claim 3,
 wherein the first gate spacer comprises a first thickness along the first direction,
 wherein the second gate spacer comprises a second thickness along the first direction,
 wherein the second thickness is greater than the first thickness.

5. The semiconductor device of claim 4, wherein the second thickness is greater than the first thickness by between 0.5 nm and about 5 nm.

6. The semiconductor device of claim 1, further comprising:
a first source/drain contact in contact with the first source/drain feature; and
a second source/drain contact in contact with the third source/drain feature,
wherein the first source/drain contact comprises a first contact width along the first direction,
wherein the second source/drain contact comprises a second contact width along the first direction,
wherein the second contact width is greater than the first contact width.

7. The semiconductor device of claim 6, wherein a ratio of the second contact width to the first contact width is between about 1.2 and about 3.

8. The semiconductor device of claim 1, further comprising:
a substrate comprising a p-type well region,
wherein the first transistor and the second transistor are disposed over the p-type well region.

9. A semiconductor device, comprising:
a substrate comprising a p-type well region;
a plurality of first transistors disposed over the p-type well region, each of the plurality of first transistors comprising a first gate structure; and
a plurality of second transistors disposed over the p-type well region, each of the plurality of second transistors comprising a second gate structure,
wherein the first gate structures extend lengthwise and are disposed at a first pitch,
wherein the second gate structures extend lengthwise and are disposed at a second pitch greater than the first pitch.

10. The semiconductor device of claim 9, wherein a ratio of the second pitch to the first pitch is between about 1.4 and about 4.

11. The semiconductor device of claim 9,
wherein each of the plurality of first transistors further comprises a plurality of first channel members wrapped around by the first gate structure,
wherein each of the plurality of second transistors further comprises a plurality of second channel members wrapped around by the second gate structure.

12. The semiconductor device of claim 11,
wherein the plurality of first channel members extend between a first source/drain feature and a second source/drain feature along a first direction,
wherein the plurality of second channel members extend between a third source/drain feature and a fourth source/drain feature along the first direction.

13. The semiconductor device of claim 12, wherein a height of the first source/drain feature is greater than a height of the second source/drain feature.

14. The semiconductor device of claim 12,
wherein the first source/drain feature and the second source/drain feature comprise a first width along the first direction,
wherein the third source/drain feature and the fourth source/drain feature comprises a second width along the first direction,
wherein the second width is greater than the first width.

15. The semiconductor device of claim 9,
wherein the first gate structure comprises a first gate length,
wherein the second gate structure comprises a second gate length greater than the first gate length.

16. A semiconductor device, comprising:
a substrate comprising a doped well region;
a plurality of first transistors comprising disposed over the doped well region, each of the plurality of first transistors comprising a first gate structure; and
a plurality of second transistors disposed over the doped well region, each of the plurality of second transistors comprising a second gate structure,
wherein the first gate structures comprises a first gate length,
wherein the second gate structures comprises a second gate length greater than the first gate length.

17. The semiconductor device of claim 16,
wherein the first gate structure extends lengthwise and are disposed at a first pitch,
wherein the second gate structure extends lengthwise and are disposed at a second pitch greater than the first pitch.

18. The semiconductor device of claim 17, wherein a ratio of the second pitch to the first pitch is between about 1.4 and about 4.

19. The semiconductor device of claim 16,
wherein each of the plurality of first transistors further comprises a plurality of first channel members wrapped around by the first gate structure,
wherein each of the plurality of second transistors further comprises a plurality of second channel members wrapped around by the second gate structure.

20. The semiconductor device of claim 19,
wherein the plurality of first channel members extend between a first source/drain feature and a second source/drain feature along a first direction,
wherein the plurality of second channel members extend between a third source/drain feature and a fourth source/drain feature along the first direction.

* * * * *

UNITED STATES PATENT AND TRADEMARK OFFICE
CERTIFICATE OF CORRECTION

PATENT NO. : 11,948,940 B2
APPLICATION NO. : 17/869069
DATED : April 2, 2024
INVENTOR(S) : Jhon Jhy Liaw Page 1 of 1

It is certified that error appears in the above-identified patent and that said Letters Patent is hereby corrected as shown below:

In the Claims

Claim 1, Column 16, Lines 39-40, change "wherein a height of the first source/drain feature is greater than a height of the second source/drain feature," to --wherein a height of the first source/drain feature is greater than a height of the third source/drain feature,--

Signed and Sealed this
Twenty-third Day of July, 2024

Katherine Kelly Vidal
*Director of the United States Patent and Trademark Office*